United States Patent
Dong et al.

(10) Patent No.: US 10,418,816 B2
(45) Date of Patent: Sep. 17, 2019

(54) PASSIVE ISLANDING-TO-GRID-CONNECTED SWITCH METHOD

(71) Applicants: NR Electric Co., Ltd., Nanjing, Jiangsu (CN); NR Engineering Co., Ltd., Nanjing, Jiangsu (CN)

(72) Inventors: Yunlong Dong, Jiangsu (CN); Jie Tian, Jiangsu (CN); Zhaoqing Hu, Jiangsu (CN); Haiying Li, Jiangsu (CN); Dongming Cao, Jiangsu (CN); Haibin Liu, Jiangsu (CN); Yu Lu, Jiangsu (CN)

(73) Assignees: NR Electric Co., Ltd., Nanjing, Jiangsu (CN); NR Engineering Co., Ltd., Nanjing, Jiangsu (CN)

(*) Notice: Subject to any disclaimer, the term of this patent is extended or adjusted under 35 U.S.C. 154(b) by 211 days.

(21) Appl. No.: 15/534,024

(22) PCT Filed: Dec. 9, 2015

(86) PCT No.: PCT/CN2015/096747
§ 371 (c)(1),
(2) Date: Jun. 8, 2017

(87) PCT Pub. No.: WO2016/101787
PCT Pub. Date: Jun. 30, 2016

(65) Prior Publication Data
US 2018/0219380 A1    Aug. 2, 2018

(30) Foreign Application Priority Data
Dec. 23, 2014  (CN) .......................... 2014 1 0812231

(51) Int. Cl.
*H02J 1/00*  (2006.01)
*H02J 3/00*  (2006.01)
(Continued)

(52) U.S. Cl.
CPC ............. *H02J 3/36* (2013.01); *H02H 7/1222* (2013.01); *H02J 3/38* (2013.01);
(Continued)

(58) Field of Classification Search
CPC .... H02J 3/36; H02J 2003/388; H02H 7/1222; H03L 7/08
See application file for complete search history.

(56) References Cited

U.S. PATENT DOCUMENTS

| 7,408,268 B1 * | 8/2008 | Nocentini | H02J 3/38 307/16 |
| 2005/0135031 A1 * | 6/2005 | Colby | H02J 3/42 361/78 |

(Continued)

FOREIGN PATENT DOCUMENTS

| CN | 102255329 | 11/2011 |
| CN | 102403735 | 4/2012 |

(Continued)

OTHER PUBLICATIONS

International Search Report of PCT/CN2015/096747 dated Mar. 22, 2016, 4 pages. (English and Chinese).

*Primary Examiner* — Rexford N Barnie
*Assistant Examiner* — Rasem Mourad
(74) *Attorney, Agent, or Firm* — Rankin, Hill & Clark LLP

(57) ABSTRACT

The present invention discloses a passive islanding to grid-connection switching method for a VSC HVDC transmission system. When the VSC HVDC transmission system in an island operation state, whether the VSC HVDC transmission system enters an grid-connection state is determined by detecting whether an overcurrent phenomenon has occurred in a converter valve-side three-phase alternating-current or a converter bridge arm current, and detecting a change status of an alternating-current side voltage. The (Continued)

system is controlled to switch from an island operation control mode to a grid-connection control mode. At a moment of switching, the online control mode is smoothly switched to by changing a power instruction and performing phase tracking on a current grid voltage, so that continuous operation of the system is maintained.

5 Claims, 2 Drawing Sheets

(51) Int. Cl.
    *H02J 3/36*     (2006.01)
    *H02J 3/38*     (2006.01)
    *H02H 7/122*     (2006.01)
    *H03L 7/08*     (2006.01)

(52) U.S. Cl.
    CPC ........... *H02J 2003/388* (2013.01); *H03L 7/08* (2013.01); *Y02E 60/60* (2013.01)

(56) References Cited

U.S. PATENT DOCUMENTS

| | | | |
|---|---|---|---|
| 2012/0013376 A1* | 1/2012 | Thacker | H03L 7/085 327/156 |
| 2014/0103727 A1 | 4/2014 | Taimela et al. | |
| 2014/0210282 A1* | 7/2014 | Dong | H03L 7/08 307/151 |
| 2014/0225457 A1* | 8/2014 | Elliott, II | H02J 3/38 307/125 |
| 2014/0312882 A1* | 10/2014 | Dong | G01R 31/42 324/76.53 |

FOREIGN PATENT DOCUMENTS

| | | |
|---|---|---|
| CN | 102510124 | 6/2012 |
| CN | 104485683 | 4/2015 |

* cited by examiner

PASSIVE ISLANDING-TO-GRID-CONNECTED SWITCH METHOD

BACKGROUND

Technical Field

The present invention relates to the field of power electronics, and in particular, to an island-to-active network switching method for a VSC-HVDC transmission system.

Related Art

The voltage source type converter is used for high direct-current transmission, and active power and reactive power can be controlled independently and fast, so as to improve system stability, inhibit fluctuation of a system frequency and a system voltage, and improve stable performance of a grid-connection alternating-current system. Flexible direct-current transmission has great advantages in fields such as new energy grid connection, distributed power generation grid connection, island power supply, and urban distribution network power supply. Therefore, researches on technologies related to flexible direct-current transmission have important meanings.

When a flexible direct-current transmission system is in an island operation state, a proximal-end in a converter station is closed to connect to an alternating-current grid or a remote-end switch is closed. A flexible direct-current converter station is connected in parallel to an active grid for operation. The flexible direct-current system needs to switch from a current island operation control mode to a grid-connected operation control mode, to maintain continuous operation of the direct-current transmission system.

When a flexible direct-current transmission system is in an island operation state, if the flexible direct-current transmission system enters an grid-connected state because of a close operation on a switch, a moment at which the flexible direct-current transmission system enters the grid-connected state needs to be accurately detected, and the current island operation needs to be switch into active operation in time. Otherwise, relatively long duration will cause the grid to be out-of-synchronization, and consequently the VSC HVDC transmission system stops operation. Meanwhile, smooth switching to operation in an online manner is also required, so that the VSC HVDC transmission system is prevented from performing a protection action and being out of service that are caused by an overcurrent or overvoltage phenomenon aroused at a switching moment. Currently, there no report related to a detection manner for detecting a change of a grid operation manner by a flexible direct-current transmission system in an island operation state for entering an online state and smoothness control.

BRIEF DESCRIPTION

An objective of the present invention is to provide a method for detecting a change of a grid operation manner by a flexible direct-current transmission system in an island operation state for entering an grid-connected state, so as to ensure accurate and smooth switching of the flexible direct-current transmission system from an island operation state to an online operation state.

To achieve the foregoing objective, a technical solution is used in the present invention:

A control system determines, by detecting whether an overcurrent phenomenon occurs in a converter bridge arm current and change statuses of network-side and valve-side voltages, whether a VSC HVDC transmission system enters a grid-connected state, including the following steps:

(1) when a converter station of the VSC HVDC transmission system is in an island operation state, detecting whether overcurrent occurs in a converter valve-side three-phase alternating-current or a converter bridge arm current, and setting an overcurrent constant value to n times rated bridge arm current; if overcurrent occurs and the overcurrent lasts for a duration t1, performing step (2); and otherwise, performing step (1) again;

(2) Blocking a converter, and detecting whether an alternating-current side voltage is lower than a threshold; if the voltage is lower than the threshold and lasts for a duration t2, deblocking the converter and performing step (1) again; and otherwise, performing step (3); and (3) controlling setting of a system phase-locked loop to track the current alternating-current side voltage phase, at the same time, starting to switch a control mode, switching from a current island control mode of the converter station of the flexible direct-current transmission system to an active control mode, and unlocking the converter.

In the foregoing step (1), the overcurrent constant value is set to n times a converter rated valve-side current or a converter bridge arm current. A value range of n is 1 to 10, a value range of the duration t1 is 0 to 1 s, and a value range of t2 is 0 to 1 s.

In the foregoing step (2), a value range of the threshold of the alternating-current side voltage is 0 to 0.99 pu, and a value range of a duration t is 0 to 1 s.

At a moment of switching the control mode in step (3), active power and reactive power instructions maintain current operation values of an active power and a reactive power. Alternatively, an active power and are active power may be 0, and may gradually increase, by means of a slope, to current operation values.

The present invention further includes an island-to-online control apparatus, including a converter overcurrent detection unit, an alternating-current side voltage detection unit, and an island-to-online mode switching unit.

When a converter station of a VSC HVDC transmission system is in island operation state, the converter overcurrent detection unit detects whether overcurrent occurs in a converter valve-side three-phase alternating-current or a converter bridge arm current, and sets an overcurrent constant value to n times rated bridge arm current; if overcurrent occurs, and the overcurrent lasts for a duration t1, the alternating-current side voltage detection unit works; and otherwise, the converter overcurrent detection unit works again.

The alternating-current side voltage detection unit first locks a converter, and then detects whether an alternating-current side voltage is lower than a threshold; if the voltage is lower than the threshold and lasts for a duration t2, the converter is unlocked, and the converter overcurrent detection unit continues to perform detection; and otherwise, the island-to-online mode switching unit works.

A function of the island-to-online mode switching unit is switching a control mode; at a moment of switching the control mode, active power and reactive power instructions maintain current operation values of an active power and a reactive power; or, after the switching, an active power and a reactive power are converted to 0, and gradually increase to operation values before the switching.

The present invention further includes an island-to-online control system, including a converter, an upper layer controller, and a valve-controlled apparatus, where (1) when a converter station of a flexible direct-current transmission system is in an island operation state, the upper layer controller detects whether overcurrent occurs in a converter valve-side three-phase alternating-current or a converter bridge arm current, and sets an overcurrent constant value to n times a rated bridge arm current; if overcurrent occurs, and the overcurrent lasts for a duration t1, step (2) is performed, otherwise, step (1) is performed again;

(2) a converter is blocked, and it is detected whether an alternating-current side voltage is lower than a threshold; if the voltage is lower than the threshold and lasts for a duration t2, the converter is deblocked, and step (1) is performed again; and otherwise, step (3) is performed;

(3) the upper layer controller sets a phase-locked loop to track the current alternating-current side voltage phase, at the same time, starts to switch a control mode, switches from a current island control mode of the converter station of the flexible direct-current transmission system to an active control mode, and unlocks the converter.

After the foregoing solutions are adopted, the present invention has the following beneficial effects:

In the method for detecting a change of a grid operation manner by a flexible direct-current transmission system in an island operation state for entering an online state provided in the present invention, detection on a grid connection moment is accurate, and an online operation manner may be smoothly switched to without causing an impact on a grid.

DETAILED DESCRIPTION

Figure 1:
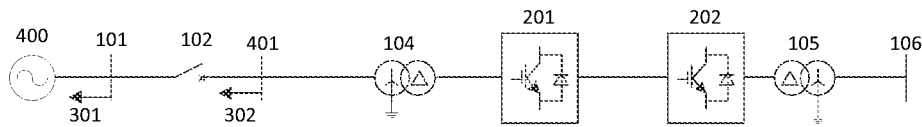
FIG. 1 is a schematic structural diagram of double stations of a VSC HVDC transmission system.
Figure 2:
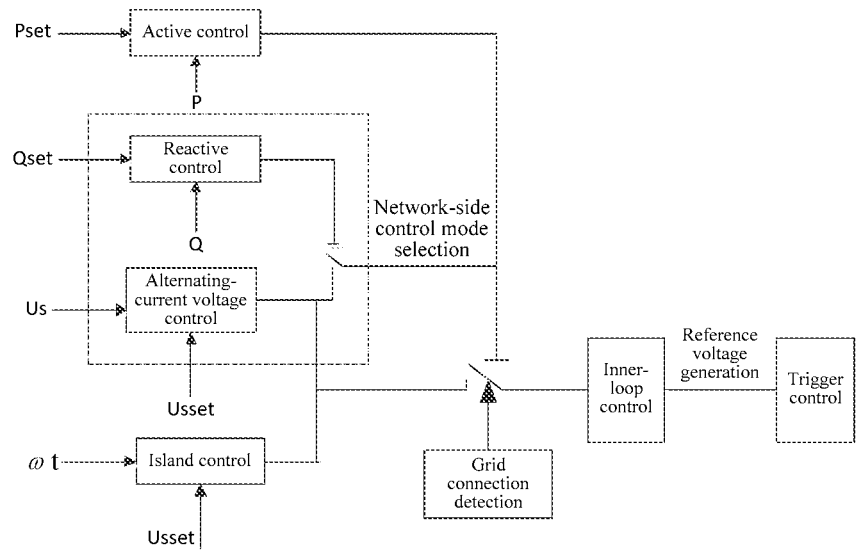
FIG. 2 is a schematic diagram of a control mode of a grid connection detection converter station.
Figure 3:
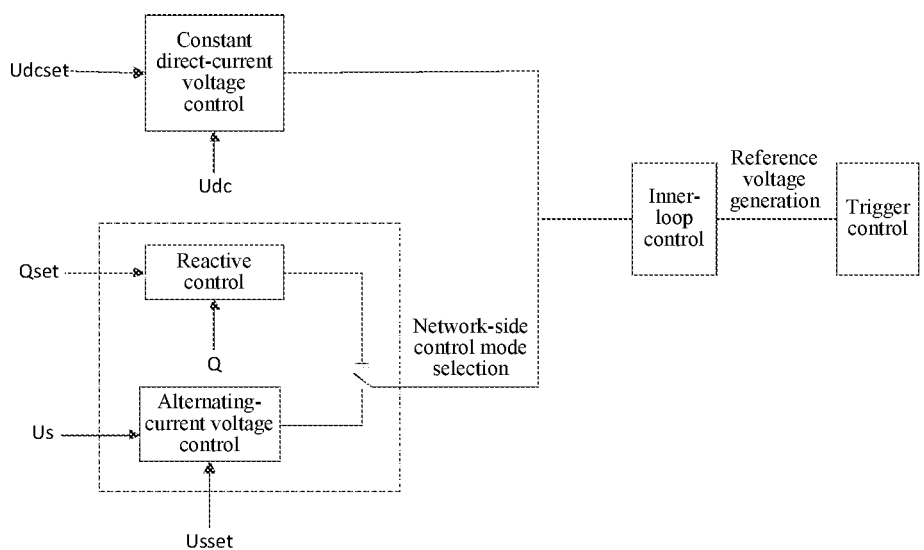
FIG. 3 is a schematic diagram of a control mode of a constant direct-current voltage control station.
Figure 4:
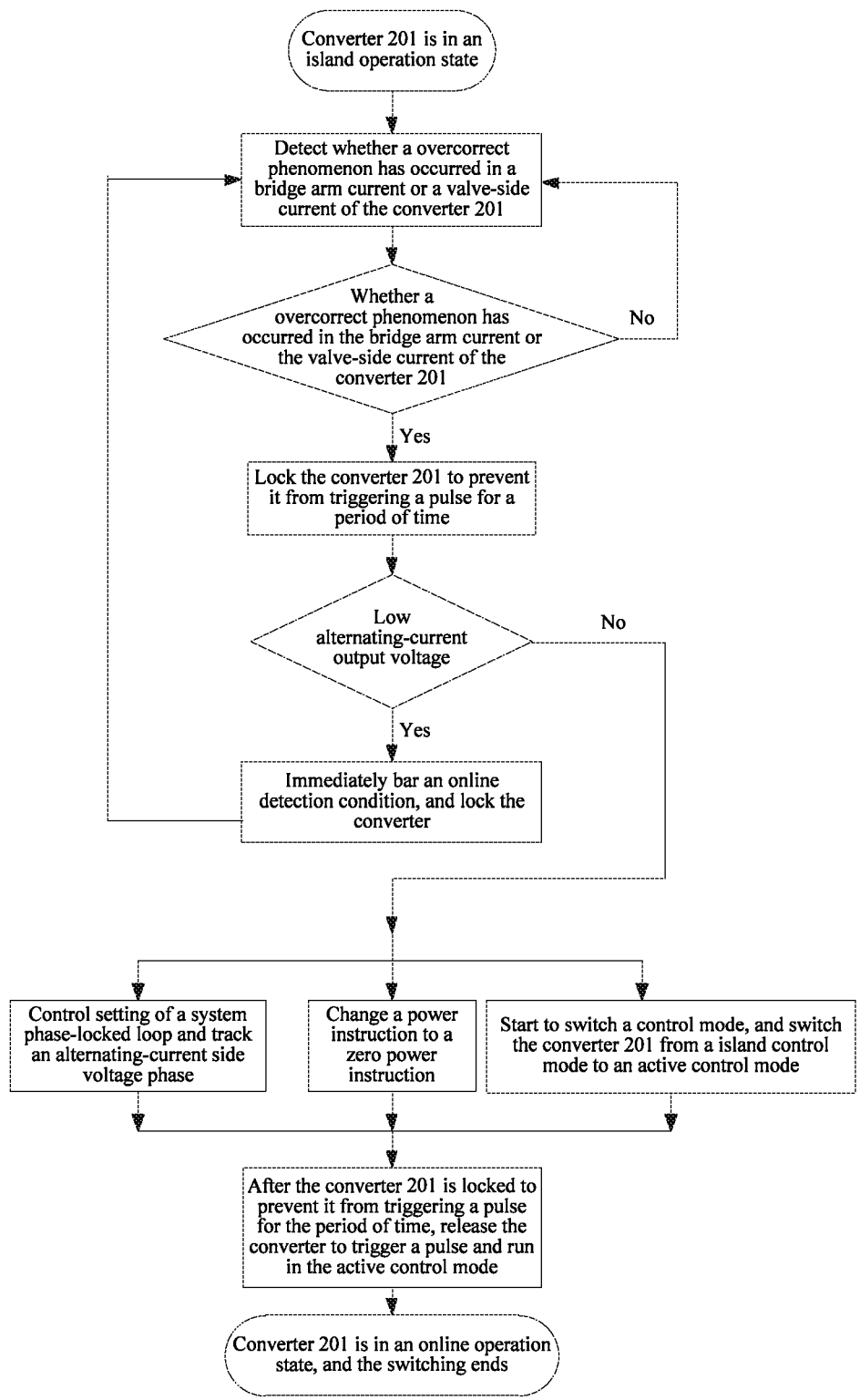
FIG. 4 is a flowchart of VSC HVDC grid connection detection in an island operation mode.

The technical solutions are described below in detail with reference to accompany drawings and specific embodiments As shown in FIG. 1, flexible direct-current transmission converter stations 201 and 202 are in an island operation state. When a remote-end switch 102 is not closed, Voltage Source Converter High Voltage Direct Current (VSC HVDC) transmission systems 201 and 202 are not connected to an alternating-current grid 400, and the VSC HVDC transmission systems 201 and 202 are in an island operation state. 202 is a constant direct-current voltage control side. Refer to FIG. 3 for a control mode of 202. 201 uses a control mode in FIG. 2. FIG. 3 shows a constant direct-current voltage control mode, which remains unchanged before and after switching. An active control mode is switched to when an online state is detected in a grid connection detection section in FIG. 2. If the switch 102 is closed, whether to switch from an island operation to online state operation is detected (refer to FIG. 4) according to the following steps:

(1) When a converter station of the flexible direct-current transmission system is in an island operation state, detect whether overcurrent occurs in a converter valve-side three-phase alternating-current or a converter bridge arm current, and set an overcurrent constant value to n times a rated bridge arm current; if overcurrent occurs and the overcurrent lasts for a duration t1, perform step (2); and otherwise, perform step (1) again.

(2) Block a converter, and detect whether an alternating-current side voltage is lower than a threshold; if the voltage is lower than the threshold and lasts for a duration t2, unlock the converter and perform step (1) again; and otherwise, perform step (3).

(3) Control setting of a system phase-locked loop to track a current alternating-current side voltage phase, at the same time, start to switch a control mode, switch from a current island control mode of the converter station of the flexible direct-current transmission system to an active control mode, and unlock the converter.

A value range of the duration t1 is 0 to 1 s, and a value range of t2 is 0 to 1 s.

After the switch 102 is closed, if a network-side 400 is in an active state, the converter 201 switches from an island control mode to an active control mode according to the foregoing steps. In a special case, the network-side 400 is a passive system. After the switch 102 is closed, a bridge arm overcurrent phenomenon does not occur in a normal status. Therefore, the control mode is not switched. Alternatively, after the converter is locked, if it is detected that an alternating-current side voltage is lower than a threshold, an online detection condition is immediately barred for a period of time, it is forbidden to switch from island operation to online operation, and at the same time, the converter is immediately released to trigger a pulse. The online detection process ends, and the converter 201 still maintains an original island operation state.

The present invention further provides a passive islanding-to-grid connected control apparatus, including a converter overcurrent detection unit, an alternating-current side voltage detection unit, and an island-to-online mode switching unit. When a converter station of a VSC HVDC transmission system is in an island operation state, the converter overcurrent detection unit detects whether overcurrent occurs in a converter valve-side three-phase alternating-current or a converter bridge arm current, and sets an overcurrent constant value to n times a rated bridge arm current; if overcurrent occurs, and the overcurrent lasts for a duration t1, the alternating-current side voltage detection unit works; and otherwise, the converter overcurrent detection unit works again.

The alternating-current side voltage detection unit first locks a converter, and then detects whether an alternating-current side voltage is lower than a threshold; if the voltage is lower than the threshold and lasts for a duration t2, the converter is deblocked, and the converter overcurrent detection unit continues to perform detection; and otherwise, the passive islanding to grid-connection mode switching unit works.

A function of the passive islanding to grid-connection mode switching unit is switching a control mode; at a moment of switching the control mode, active power and reactive power instructions maintain current operation values of an active power and a reactive power; or, after switching, an active power and a reactive power are converted to 0, and gradually increase to operation values before the switching.

The present invention further provides a passive islanding to grid-connection control system, including a converter, an upper layer controller, and a valve-controlled apparatus, where (1) when a converter station of a VSC HVDC transmission system is in an island operation state, the upper layer controller detects whether overcurrent occurs in a converter valve-side three-phase alternating-current or a converter bridge arm current, and sets an overcurrent constant value to n times a rated bridge arm current; if overcurrent occurs, and the overcurrent lasts for a duration t1, step (2) is performed, otherwise, step (1) is performed again;

(2) A converter is blocked, and it is detected whether an alternating-current side voltage is lower than a threshold; if the voltage is lower than the threshold and lasts for a duration t2, the converter is unlocked, and step (1) is performed again; and otherwise, step (3) is performed.

(3) The upper layer controller sets a phase-locked loop to track a current alternating-current side voltage phase, at the same time, starts to switch a control mode, switches from a current island control mode of the converter station of the VSC HVDC transmission system to an active control mode, and deblocked the converter.

The foregoing embodiments are merely used to describe technical ideas of the present invention and do not define the protection scope of the present invention. All the technical ideas proposed according to the present invention and any modifications made based on the technical solutions all fall into the protection scope of the present invention.

The invention claimed is:

1. A passive islanding to grid-connection switching method for a Voltage Source Converter High Voltage Direct Current (VSC HVDC) transmission system, wherein comprising the following steps:

(1) when a converter station of the VSC HVDC transmission system is in a passive islanding operation state, detecting whether overcurrent occurs in a converter valve-side three-phase alternating-current or a converter bridge arm current, and setting an overcurrent constant value to n times a rated bridge arm current; if overcurrent occurs, and the overcurrent lasts for a duration t1, performing step (2); and otherwise, performing step (1) again;

(2) Blocking a converter, and detecting whether an alternating-current side voltage is lower than a threshold; if the voltage is lower than the threshold and lasts for a duration t2, unlocking the converter and performing step (1) again; and otherwise, performing step (3); and (3) controlling setting of a system phase-locked loop to track a current alternating-current side voltage phase, at the same time, starting to switch a control mode, switching from a current island control mode of the converter station of the VSC HVDC transmission system to an active control mode, and deblocking the converter.

2. The passive islanding to grid-connection switching method for a flexible direct-current transmission system according to claim 1, wherein in step (1), the overcurrent constant value is set to n times a converter rated valve-side current or a rated bridge arm current; a value range of n is 1 to 10, a value range of the duration t1 is 0 to 1 s, and a value range of t2 is 0 to 1 s.

3. The passive islanding to grid-connection method for the VSC HVDC transmission system according to claim 1, wherein in step (2), a value range of the threshold of the alternating-current side voltage is 0 to 0.99 pu, and a value range of a duration t is 0 to 1 s.

4. The passive islanding to grid-connection method for a flexible direct-current transmission system according to claim 1, wherein at a moment of switching the control mode in step (3), active power and reactive power instructions maintain current operation values of an active power and a reactive power; or, after the switching, an active power and a reactive power are converted to 0, and gradually increase to operation values before the switching.

5. A passive islanding to grid-connection control system, comprising a converter, an upper layer controller, and a valve-controlled apparatus, wherein (1) when a converter station of a flexible direct-current transmission system is in an island operation state, the upper layer controller detects whether overcurrent occurs in a converter valve-side three-phase alternating-current or a converter bridge arm current, and sets an overcurrent constant value to n times a rated bridge arm current; if overcurrent occurs, and the overcurrent lasts for a duration t1, step (2) is performed, otherwise, step (1) is performed again;

(2) a converter is blocked, and it is detected whether an alternating-current side voltage is lower than a threshold; if the voltage is lower than the threshold and lasts for a duration t2, the converter is unlocked, and step (1) is performed again; and otherwise, step (3) is performed; and (3) the upper layer controller sets a phase-locked loop to track a current alternating-current side voltage phase, at the same time, starts to switch a control mode, switches from a current island control mode of the converter station of the flexible direct-current transmission system to an active control mode, and unlocks the converter.

* * * * *